(12) United States Patent
Qiu et al.

(10) Patent No.: US 10,039,165 B2
(45) Date of Patent: Jul. 31, 2018

(54) MULTI-PAD, MULTI-JUNCTION LED PACKAGE

(71) Applicant: LUMILEDS LLC, San Jose, CA (US)

(72) Inventors: Yifeng Qiu, San Jose, CA (US);
Gregory Guth, San Jose, CA (US);
Jeroen den Breejen, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/584,546

(22) Filed: May 2, 2017

(65) Prior Publication Data

US 2017/0318637 A1    Nov. 2, 2017

Related U.S. Application Data

(60) Provisional application No. 62/330,754, filed on May 2, 2016.

(30) Foreign Application Priority Data

Jun. 17, 2016   (EP) .................................. 16175057

(51) Int. Cl.
*H05B 33/08* (2006.01)
*F21V 23/04* (2006.01)
(Continued)

(52) U.S. Cl.
CPC ......... *H05B 33/0842* (2013.01); *F21V 23/04* (2013.01); *H01L 25/0753* (2013.01);
(Continued)

(58) Field of Classification Search
CPC .............. H05B 33/083; H05B 33/0815; H05B 33/0842; H05B 33/0845; H05B 33/0812;
(Continued)

(56) References Cited

U.S. PATENT DOCUMENTS 8,384,307 B2 * 2/2013 Grajcar ............. H05B 33/0848
                                            315/185 R
8,461,613 B2 * 6/2013 Chou ..................... H05B 33/12
                                            257/88

(Continued)

FOREIGN PATENT DOCUMENTS

EP    2 563 094 A2    2/2013
EP    2 645 816 A1   10/2013
(Continued)

OTHER PUBLICATIONS

EP Search Report, EP Patent Application No. 16 173 125.2, dated Dec. 16, 2016, 6 pages.

*Primary Examiner* — Vibol Tan
(74) *Attorney, Agent, or Firm* — Volpe and Koenig, P.C.

(57) ABSTRACT

A light emitting diode ("LED") module is disclosed. The LED module includes a first LED tap and a second LED tap, the first tap being powered on for a longer amount of time than the second LED tap, based on an alternating current voltage. The LED module also includes a first LED package on which a first LED associated with the first LED tap and a second LED associated with the second LED tap are disposed. The LED module further includes a second LED package on which a third LED associated with the first LED tap and a fourth LED associated with the second LED tap are disposed.

20 Claims, 7 Drawing Sheets

(51) Int. Cl.
*H01L 27/15* (2006.01)
*H01L 25/075* (2006.01)
*H05B 37/02* (2006.01)

(52) U.S. Cl.
CPC ......... *H01L 27/15* (2013.01); *H05B 33/0809* (2013.01); *H05B 33/089* (2013.01); *H05B 33/0845* (2013.01); *H05B 37/02* (2013.01)

(58) Field of Classification Search
CPC .......... H05B 37/02; H05B 33/0806; H05B 33/0824; H05B 39/06; H05B 41/39; H05B 33/0896; H05B 37/036; Y02B 20/345; Y02B 20/347; Y02B 20/343; Y02B 20/346; F21K 9/00; F21V 23/04; H01L 25/0753; H01L 27/15
See application file for complete search history.

(56) References Cited

U.S. PATENT DOCUMENTS

| | | | | |
|---|---|---|---|---|
| 8,569,956 B2 * | 10/2013 | Shteynberg | ......... | H05B 33/083 315/119 |
| 8,653,752 B2 * | 2/2014 | Sakuragi | ......... | H05B 33/083 315/185 R |
| 8,917,027 B2 * | 12/2014 | Radermacher | ..... | H05B 33/0821 315/200 R |
| 9,485,821 B2 * | 11/2016 | Li | ......... | H05B 33/0887 |
| 9,507,246 B2 * | 11/2016 | Gyoten | ......... | G03B 21/2053 |
| 9,775,204 B2 * | 9/2017 | Kang, II | ......... | H05B 33/0815 |
| 9,807,827 B2 * | 10/2017 | Miskin | ......... | H05B 33/0809 |
| 2003/0102810 A1 * | 6/2003 | Cross | ......... | H05B 33/0803 315/74 |
| 2011/0130064 A1 * | 6/2011 | Wang | ......... | H01L 25/0753 445/23 |
| 2012/0229030 A1 * | 9/2012 | Moskowitz | ......... | H05B 33/0809 315/122 |
| 2014/0252967 A1 * | 9/2014 | van de Ven | ......... | H05B 33/0863 315/188 |
| 2014/0361696 A1 | 12/2014 | Siessegger et al. | | |
| 2015/0373799 A1 | 12/2015 | Bong et al. | | |
| 2016/0165680 A1 | 6/2016 | Johnson et al. | | |

FOREIGN PATENT DOCUMENTS

| | | |
|---|---|---|
| EP | 2 645 818 A1 | 10/2013 |
| WO | 2016/020402 A1 | 2/2016 |

* cited by examiner

US 10,039,165 B2

MULTI-PAD, MULTI-JUNCTION LED PACKAGE

CROSS-REFERENCE TO RELATED PATENT APPLICATION

This application claims the benefit of U.S. Provisional Application No. 62/330,754 filed on May 2, 2016 and European Provisional Application No. 16175057.5 filed on Jun. 17, 2016, the content of which is hereby incorporated by reference herein as if fully set forth.

FIELD OF INVENTION

This disclosure relates to AC-powered LED illumination techniques, and more particularly to techniques for an apparatus using a tapped linear driver (TLD) with multi-pad, multi junction LED packages.

BACKGROUND

Light emitting diodes ("LEDs") are becoming more commonly used as lighting sources in various scenarios. LEDs present challenges in terms of being powered directly by an alternating current power source. A traditional AC-DC (alternating current-to-direct current) converter is typically quite bulky and may not be satisfactory for many LED applications. LED technology is constantly being improved.

SUMMARY

A light emitting diode ("LED") module is disclosed. The LED module includes a first LED tap and a second LED tap, the first tap being powered on for a longer amount of time than the second LED tap, based on an alternating current voltage. The LED module also includes a first LED package on which a first LED associated with the first LED tap and a second LED associated with the second LED tap are disposed. The LED module further includes a second LED package on which a third LED associated with the first LED tap and a fourth LED associated with the second LED tap are disposed. The second LED package is disposed a distance along a housing from the first led package such that the LEDs of the first LED package appear approximately as a point light source and the LEDs of the second LED package appear approximately as a point light source, to average out lighting variations provided to the first LED tap and the second LED tap.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Reference is now made in detail to certain embodiments. The disclosed embodiments are not intended to be limiting of the claims.

Figure 1:
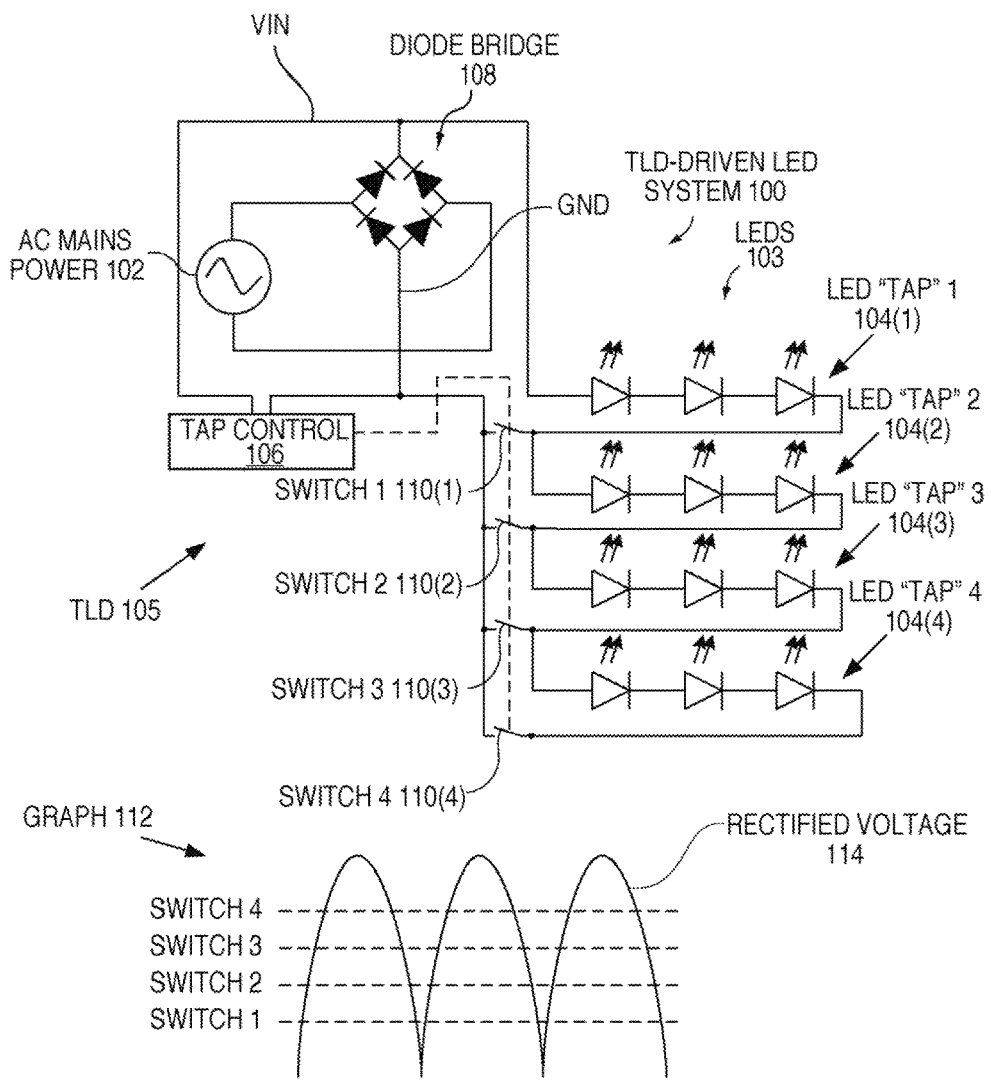
FIG. 1 illustrates a tapped linear driver ("TLD")-driven light emitting diode ("LED") system, according to an example.

FIG. 1 illustrates a tapped linear driver ("TLD")-driven light emitting diode ("LED") system 100, according to an example. The TLD-driven LED system 100 includes four LED "taps" 104 driven by a tapped linear driver ("TLD") 105, which includes a tap control 106 and switches 110, as well as the circuit configuration of the LED taps 104.

The TLD 105 is a relatively simple, cost-effective way to power direct current ("DC") circuit elements (e.g., the LEDs) from alternating current ("AC") source, such as AC mains power 102. In an example, the AC mains power 102 represents an "out-of-wall" electrical power source, that is, the power provided by an electrical wall outlet, although the AC mains power 102 could represent other alternating current power sources. More specifically, conventional AC-DC converters include bulky and expensive components such as inductors and transformers and would increase the cost and size of LED modules. The TLD 105 does not include such expensive and bulky components and can thus easily be integrated into LED modules without adding much cost or bulk.

The TLD 105 operates by sensing the instantaneous DC voltage from the power source 102 (e.g., as rectified by a diode bridge 108, which produces a high voltage at Vin and a low voltage at GND—a ground terminal) and switching on different sets of LEDs 103 at different voltage levels. More specifically, referring to graph 112, the rectified voltage 114 is illustrated. When the rectified voltage 114 exceeds a first level corresponding to switch 1 110(1), tap control 106 closes switch 1 110(1) and opens the other switches 110. When the rectified voltage 114 exceeds a second level corresponding to switch 2 110(2), tap control 106 closes switch 2 110(2) and opens the other switches 110. When the rectified voltage 114 exceeds a third level corresponding to switch 3 110(3), tap control 106 closes switch 3 110(3) and opens the other switches 110. When the rectified voltage 114 exceeds a fourth level corresponding to switch 4 110(4), tap control 106 closes switch 4 110(4) and opens the other switches 110. When the rectified voltage 114 is below the voltage corresponding to switch 1, tap control 106 causes switch 1 110(1), switch 2 110(2), switch 3 110(3), and switch 4 110(4) to be open. A resistive load (not shown) within or associated with tap control 106 may be used to complete the circuit at the top and bottom of the diode bridge 108 when switches 1-4 are open and/or at other times. Switches 110 can be any technically feasible switching mechanism such as any form of transistor or any other type of switching mechanism.

The above-described operation of the tap control 106 causes different sets of LEDs 103 to switch on depending on the instantaneous voltage of the rectified power source output from the diode bridge 108. More specifically, when switch 1 110(1) is closed, LED tap 1 104(1) is powered and thus emits light. When switch 2 110(2) is closed, both LED tap 1 104(1) and LED tap 2 104(2) are powered and thus emit light. When switch 3 110(3) is closed, LED tap 1 104(1), LED tap 2 104(2), and LED tap 3 104(3) are powered on and thus emit light, and when switch 4 110(4) is closed, LED tap 1 104(1), LED tap 2 104(2), LED tap 3 104(3), and LED tap 4 104(4) are all powered on and emit light. When all the illustrated switches 110 are open, no LED taps 104 are powered. The above operations occur because of the circuit configuration illustrated. More specifically, each LED tap 104 is electrically coupled to both a switch that branches back to the tap control 106 and to at least one another LED tap 104 in series. For example, LED tap 1 104(1) is coupled in series to the diode bridge 108 and to LED tap 2 104(2) as well as to switch 1 110(1). LED tap 2 104(2) is coupled in series to LED tap 1 104(1), to switch 2 110(2), and to LED tap 3 104(3). LED tap 3 104(3) is coupled in series to LED tap 2 104(2), to switch 3 110(3), and to LED tap 4 104(4). LED tap 4 104(4) is coupled in series to LED tap 3 104(3) and to switch 4 110(4). Thus, each individual switch 110 causes a different circuit of LEDs 103 to be connected in series to the power source.

Figure 2:
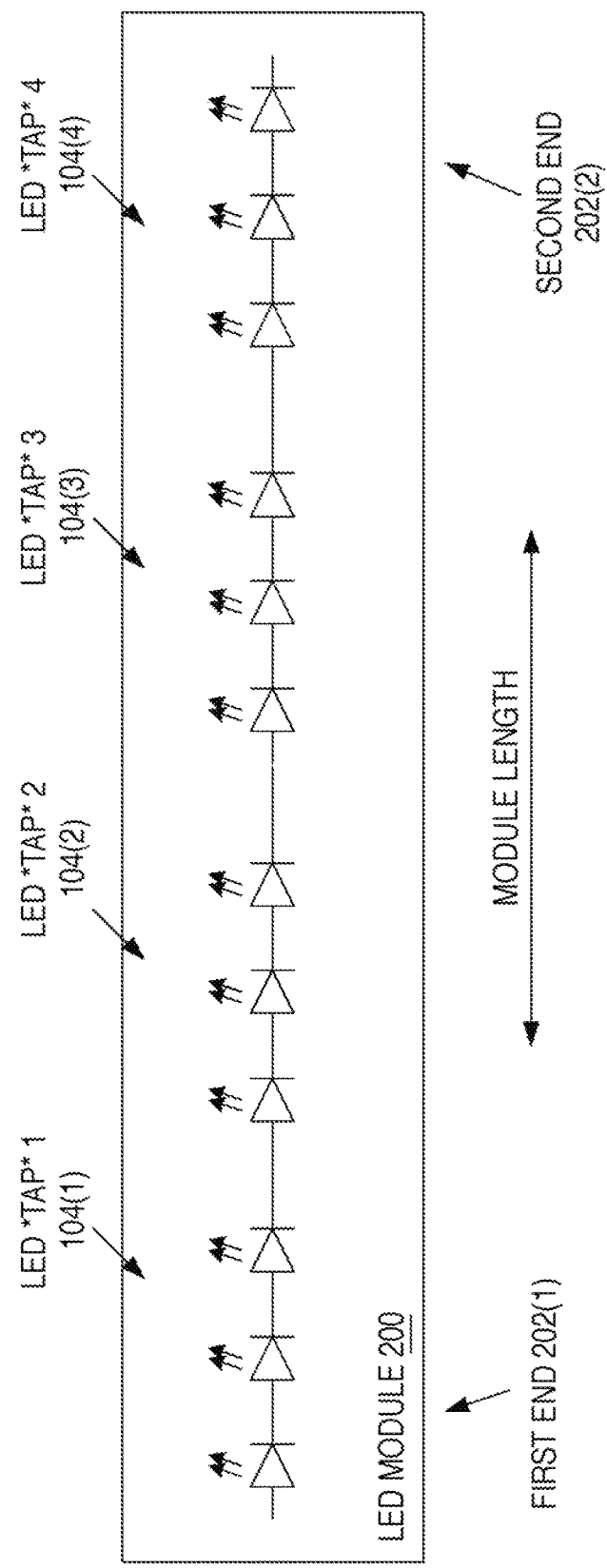
FIG. 2 illustrates an LED module including the four LED taps 104, according to an example.

As described above, powering the LEDs 103 with the tapped linear driver 105, while efficient, causes a "flicker" of the lights because the number of LEDs on at any particular moment varies. FIG. 2 illustrates an LED module 200 including the four LED taps 104, according to an example. The LED module 200 comprises a physical device in which the LEDs 103 of FIG. 1 are disposed. Various features of the LED module 200, such as the tapped linear driver 105, the connection to a power supply, other electronics, and the physical mounting means for the electronics such as the LEDs 103 and tapped linear driver 105, as well as the physical shape and configuration of the LED module are not shown for clarity of explanation.

As described with respect to FIG. 1, the different LED taps 104 are switched on for different amounts of time. LED tap 1 104(1) is switched on the most and LED tap 4 104(4) is switched on the least. This differential in switched-on time results in a very apparent flicker if the LED taps 104 are arranged in an undesirable manner. The example LED module 200 of FIG. 2 has a linear configuration of LED taps 104 in which the flicker would be pronounced. More specifically, LED tap 1 104(1) is disposed at a first end 202(1) of the LED module 200 that is opposite a second end 202(2) of the LED module 200, at which LED tap 4 104(4) is disposed. Because LED tap 104(4) is powered on for a smaller amount of time than LED tap 104(1), the second end 202(2) of the LED module 200 will exhibit both a higher degree of flickering and a lower overall brightness than the first end 202(1) of the LED module 200. The differences in respective powered-on times for LED tap 2 104(2) and led tap 3 104(3) mean that those taps 104, too, experience different degrees of flickering and different brightness levels than the other taps 104.

For the above reasons, the present disclosure provides teachings for reducing or eliminating differences in lighting quality (e.g., flicker and brightness) along an LED module. Generally, these principles involve grouping individual LEDs together in multi-LED packages and electrically and physically configuring these packages so that different LEDs in each individual package are considered part of different LED taps 104. In one example, each LED package has an LED for a different LED tap 104 of each LED tap 104 used in a single LED module. The LED packages then act as, essentially, point light sources with averaged flicker and brightness characteristics of the different taps. In another example, each LED package has an LED from different LED taps 104, but each LED package does not necessarily have an LED corresponding to each TAP in the module. In this example, LEDs in the various LED packages are coupled to groups of taps such that each LED package has similar brightness and flickering characteristics.

Figure 3A:
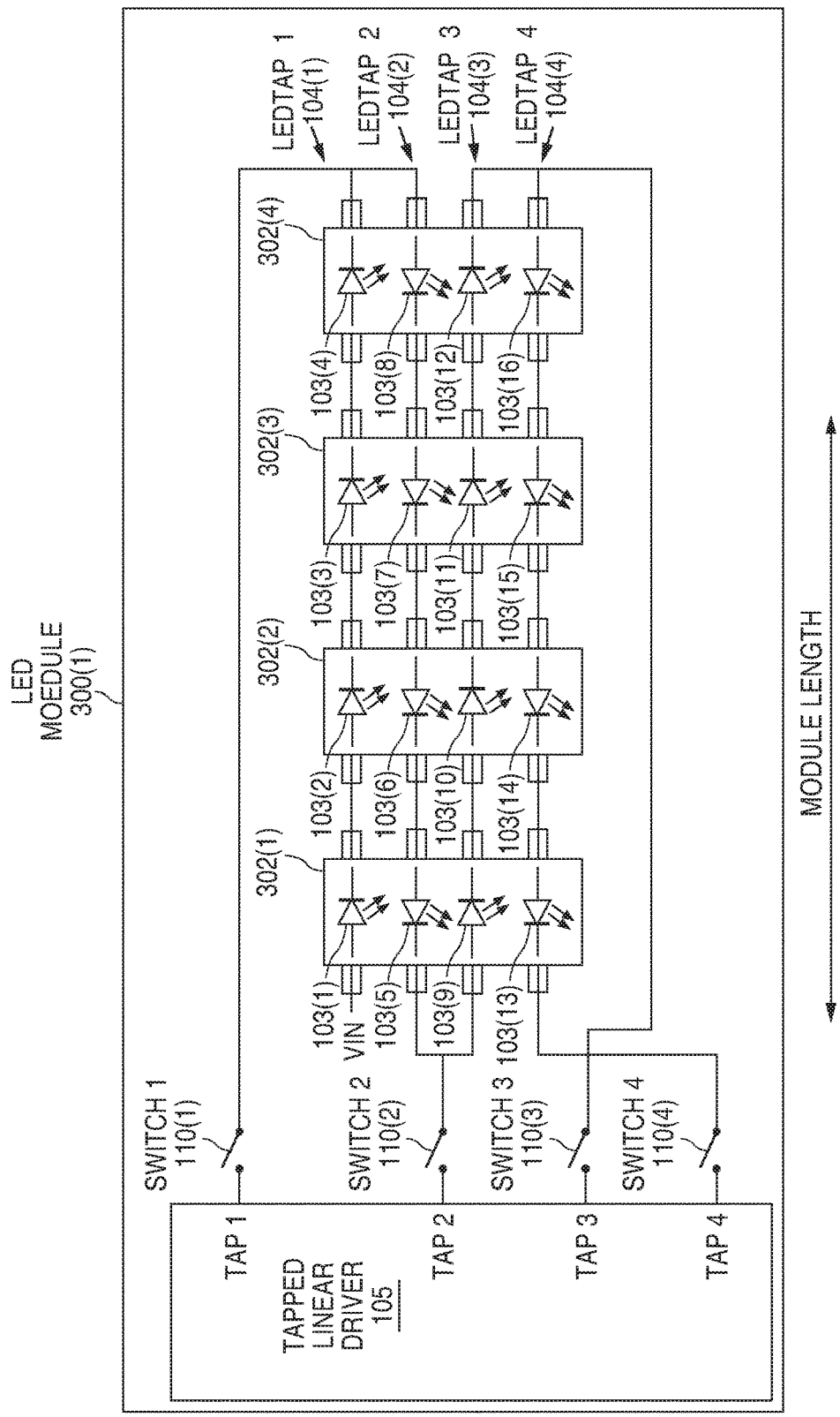
FIG. 3A illustrates an LED module including a plurality of LED packages, each of which includes one LED coupled to a different LED tap of a tapped linear driver, according to an example.

FIGS. 3A-3D illustrate configurations of LED modules that incorporate the physical and circuit arrangement techniques described above. FIG. 3A illustrates an LED module 300(1) including a plurality of LED packages 302, each of which includes one LED 103 coupled to a different LED tap 104 of a tapped linear driver 105, according to an example. By combining LEDs 103 from each different LED tap 104 on each individual LED package 302, the light emitting characteristics corresponding to the different LED taps 104 are "averaged out" on each LED package 302, resulting in each LED package 302 appearing as a single point source with such averaged out light emitting characteristics. More specifically, although not illustrated in this manner, the LED packages 302 and distances between the LEDs 103 on each LED package 302 are much smaller than the distance between LED packages along the module length, making the four different LEDs 103 in each LED package 302 appear as a point source of light when viewed in the context of the entire length of the LED module 300.

In the LED module 300(1), the LED taps 104 are connected in series to allow for selective powering on of different sets of LEDs 103. More specifically, LED tap 1 104(1) is coupled in series with Vin and with LED tap 2 104(2). LED tap 2 104(2) is coupled in series with LED tap 3 104(3), which is coupled in series with LED tap 4 104(4). Switch 1 110(1) is coupled to the connection point between LED tap 1 104(1) and LED tap 104(2) and to tap 1 of the TLD 105, in order to form a circuit between Vin and tap 1 of the TLD 105, through LED tap 1 104(1), when switch 1 110(1) is closed. Switch 2 110(2) is coupled to the connection point between LED tap 2 104(2) and LED tap 3 104(3) and to tap 2 of the TLD 105 in order to form a circuit between Vin and tap 2 of the TLD 105, through LED tap 1 104(1) and LED tap 2 104(2), when switch 2 110(2) is closed. Switch 3 110(3) is coupled to the connection point between LED tap 3 104(3) and LED tap 4 104(4) and to tap 3 of the TLD 105 in order to form a circuit between Vin and tap 3 of the TLD 105, through LED tap 1 104(1), LED tap 2 104(2), and LED tap 3 104(3), when switch 3 110(3) is closed. Switch 4 110(4) is coupled to LED tap 4 104(4) in order to form a circuit between Vin and tap 4 of the TLD 105, through all illustrated LED taps 104 when switch 4 110(4) is closed.

In operation, the TLD 105 controls the switches 110 to be either open or closed based on the instantaneous direct current ("DC") voltage of the power source (AC mains power 102 in FIG. 1). When the voltage reaches a first level, there is sufficient voltage to power at least four LEDs 103, so the TLD 105 controls switch 1 110(1) to close and controls the other switches 110 to open. Closing switch 1 110(1) forms a circuit between Vin and tap 1 of the tapped linear driver 105 (which is ultimately routed to ground), thus powering on the LEDs 103 of LED tap 1 104(1). When the voltage reaches a second level above the first level, there is sufficient voltage to power at least eight LEDs 103, so the TLD 105 controls switch 2 110(2) to close and controls the other switches 110 to open. Closing switch 2 110(2) forms a circuit between Vin and tap 2 of the tapped linear driver 105, thus powering on the LEDs 103 of both LED tap 1

104(1) and LED tap 2 104(2). When the voltage reaches a third level above the second level, there is sufficient voltage to power at least twelve LEDs 103, so the TLD 105 controls switch 3 110(3) to close and controls the other switches 110 to open. Closing switch 3 110(3) forms a circuit between Vin and tap 3 of the tapped linear driver 105, thus powering on the LEDs 103 of LED tap 1 104(1), LED tap 2 104(2), and LED tap 3 104(3). When the voltage reaches a fourth level above the third level, there is sufficient voltage to power at least sixteen LEDs 103, so the TLD 105 controls switch 4 110(4) to close and controls the other switches 110 to open. Closing switch 4 110(4) forms a circuit between Vin and tap 4 of the tapped linear driver 105, thus powering on the LEDs 103 of LED tap 1 104(1), LED tap 2 104(2), LED tap 3 104(3), and LED tap 4 104(4).

Although illustrated with particular numbers of LED packages 302, LED taps 104, LEDs 103, and the like, the embodiment of FIG. 3A is not limited to the specifically illustrated numbers. An LED module having any technically number of LED taps 104, LEDs per package 302, LEDs per LED tap 104, is contemplated, so long as there are a plurality of LED taps 104, each of which includes a plurality of LEDs 103, where the LEDs 103 in each package 302 are coupled to different taps of the TLD 105 and where the LED taps 104 are coupled in series with switches to control powering on of the LED taps 104 based on the cyclic operation of the TLD 105.

Figure 3B:
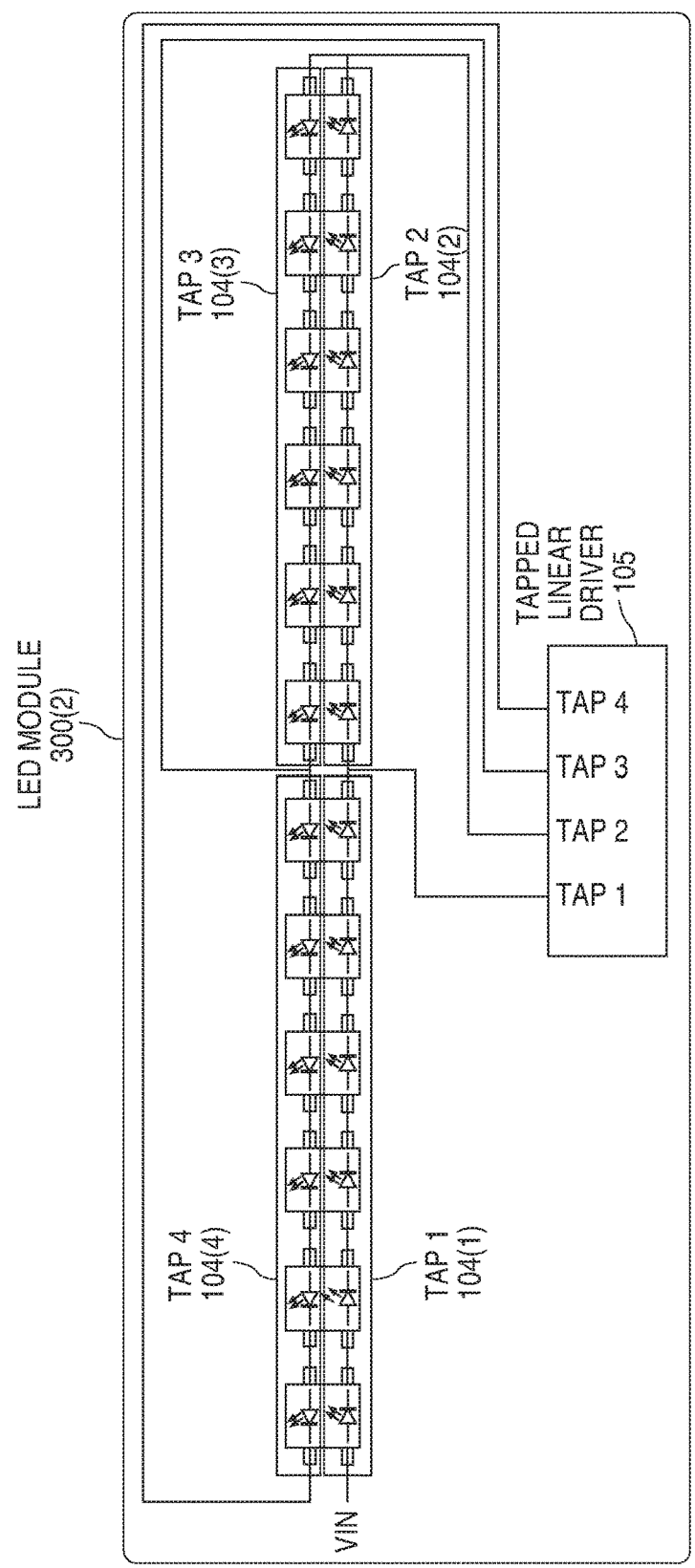
FIG. 3B illustrates an LED module in which not all LED taps are represented on each LED package, according to an example.
Figure 3C:
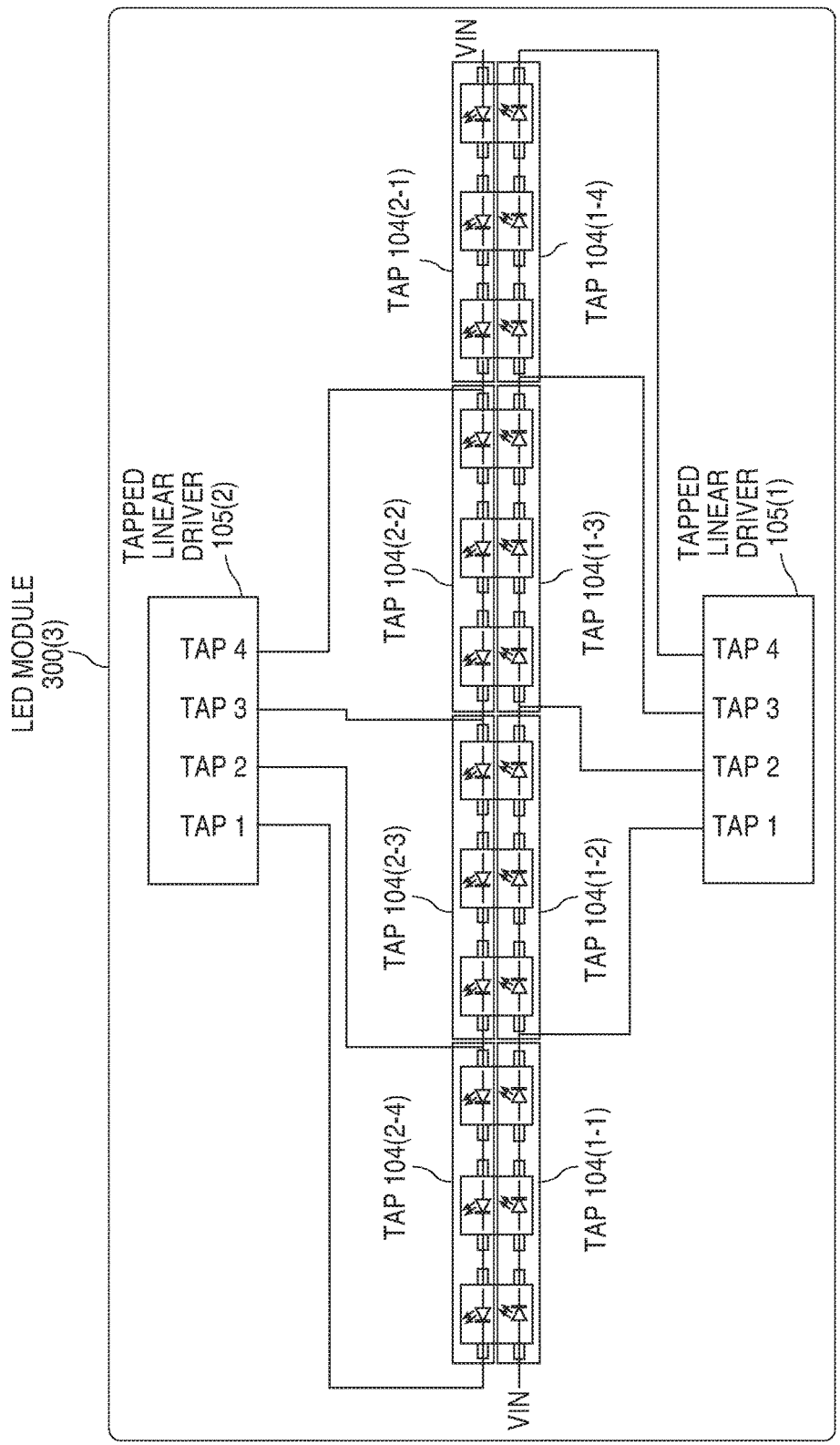
FIG. 3C illustrates an LED module in which each LED package includes an LED from only a subset of the LED taps and in which each LED package has an LED driven by different TLDs, according to an example.

FIGS. 3B and 3C illustrate alternative LED module 300 configurations, according to examples. For ease of discussion and clarity of the drawing, certain elements illustrated in FIG. 3A are not illustrated in FIG. 3B or 3C. For example, switches 110, illustrated in FIG. 3A, are not illustrated in FIG. 3B or 3C. However, those of skill in the art will understand that each tap of a TLD 105 will include an appropriate switch controlled to open or close depending on the instantaneous voltage level of an input alternating current signal. Additionally, to avoid crowding of the drawings of FIGS. 3B and 3C, the LED packages 302 illustrated in FIG. 3A are not individually numbered in FIG. 3B or 3C. However, those of skill in the art will understand that the symbol used for the LED packages 302 in FIG. 3A is also used to represent LED packages in FIGS. 3B and 3C and thus that individual numbers are not provided. Similarly, the individual LEDs 103 are not numbered in FIG. 3B or 3C. However, it will be understood by those of skill in the art that each instance of the LED symbol, which is used throughout FIGS. 3B-3C, represents an LED in a similar manner as illustrated with respect to FIG. 3A.

FIG. 3B illustrates an LED module 300(2) in which not all LED taps 104 are represented on each LED package 302, according to an example. Instead, each LED package 302 includes an LED 103 from only a subset of the LED taps 104. In the example LED module 300(2) of FIG. 3B, each LED package 302 includes two LEDs 103 coupled to two different LED taps 104. More specifically, each LED package 302 includes either two LEDs 103 associated with LED tap 104(1) and LED tap 104(4) or two LEDs 103 from LED tap 104(2) and LED tap 104(3). Although different sets of LED taps 104 are used, the different combinations of LED taps 104 produce light output having similar light emission characteristics. More specifically, LED tap 104(1) has the highest brightness and least amount of flickering and LED tap 104(4) has the lowest brightness and highest amount of flickering, while LED tap 104(2) and LED tap 104(3) have middling brightness and flickering. The average of these two combinations thus produces similar brightness and flickering characteristics. Although not shown, the TLD 105 may include current controls for each TAP in order to fine tune the brightness differences of the tap 1/tap 4 combination and the tap 2/tap 3 combination.

The LEDs 103 of LED tap 1 104(1) are coupled in series to Vin and to LED tap 2 104(2), which is coupled in series to LED tap 3 104(3), which is coupled in series to LED tap 4 104(4), which is coupled in series to tap 4 of the TLD 105. Tap 1 of the TLD 105 is coupled in between LED tap 1 104(1) and LED tap 2 104(2) to allow for a circuit to be formed between Vin and tap 1 of the TLD 105, via LED tap 1 104(1) when the switch 110 for tap 1 of the TLD 105 is closed. Tap 2 of the TLD 105 is coupled in between LED tap 2 104(2) and LED tap 3 104(3) to allow for a circuit to be formed between Vin and tap 2 of the TLD 105, via LED tap 1 104(1) and LED tap 2 104(2), when the switch 110 for tap 2 of the TLD 105 is closed. Tap 3 of the TLD 105 is coupled in between LED tap 3 104(3) and LED tap 4 104(4) to allow for a circuit to be formed between Vin and tap 3 of the TLD 105, via LED tap 1 104(1), LED tap 3 104(2), and LED tap 3 104(3), when the switch 110 for tap 3 of the TLD 105 is closed. Tap 4 of the TLD 105 is coupled to the end of LED tap 4 104(4), to allow for a circuit to be formed between Vin and tap 4 of the TLD 105 via all of the LED taps 104 illustrated when the switch 110 for tap 4 of the TLD 105 is closed. In operation, the TLD 105 cycles between closing the switch for each of taps depending on the instantaneous DC voltage of the incoming AC power signal in a similar manner as described above. This variation in tap activation causes LED tap 1 104(1) to be powered on for the longest, followed by LED tap 2 104(2), then by LED tap 3 104(3), and then by LED tap 4 104(4).

As with the LED module 300(1) of FIG. 3A, variations in the numbers of the LEDs 103 per tap, total number of LEDs 103, total number of LED packages 302, total number of taps for the TLD 105, or other variations, are possible.

FIG. 3C illustrates an LED module 300(3) in which each LED package 302 includes an LED 103 from only a subset of the LED taps 104 and in which each LED package 302 has an LED 103 driven by different TLDs 105, according to an example. The configuration of LEDs 103 in LED module 300(3) is one in which each LED package 302 produces light with similar characteristics due to a similar type of "averaging" as described with respect to FIG. 3B. More specifically, each LED package 302 has LEDs 103 that are coupled to different LED taps 104 of different TLDs 105. The different LED taps 104 are combined together in each LED package 302 to generate approximately the same lighting characteristics on each LED package 302. For example, LED packages 302 on the left-most side of the LED module 300(3) include LEDs 103 from a first tap 104(1-1) of a first TLD 105(1) and from a fourth tap 104(2-4) of a second TLD 105(2). LED packages 302 in the middle of the LED module 300(3) include LEDs 103 from two middle LED taps (i.e., either a combination of the second tap 104(1-2) from the first TLD 105(1) and the third tap 104(2-3) from the second TLD 105(2) or a combination of the third tap 104(1-3) from the first TLD 105(1) and the second tap 104(2-2) from the second TLD 105(2)), and thus have similar lighting characteristics. The LED packages 302 at the right end of the LED module 300(3) include LEDs 103 from a fourth tap 104(1-4) of the first TLD 105(1) and from a first tap 104(2-1) of the second TLD 105(2).

Two different circuits are formed in the LED module 300(3) of FIG. 3C, each circuit being associated with a different one of the TLDs 105(2). More specifically, LED tap 1 104(1-1) is coupled in series with Vin and with LED tap 104(1-2), which is coupled in series with LED tap 104(1-3), which is coupled in series with LED tap 104(1-4), which is coupled in series with tap 4 of TLD 105(1). Similarly, LED tap 1 104(2-1) is coupled in series with Vin and with LED tap 104(2-2), which is coupled in series with LED tap 104(2-3), which is coupled in series with LED tap 104(2-4), which is coupled in series with tap 4 of TLD 105(2). Tap 1 of TLD 105(1) is coupled between Vin and LED tap 104(1-1) to form a circuit from Vin to tap 1 of the TLD 105(1) when tap 1 is switched on. Tap 2 of TLD 105(1) is coupled between LED tap 104(1-2) and LED tap 104(1-3) to form a circuit from Vin to tap 2 of the TLD 105(1) when tap 2 is switched on. Tap 3 of TLD 105(1) is coupled between LED tap 104(1-3) and LED tap 104(1-4) to form a circuit from Vin to tap 3 of the TLD 105(1) when tap 3 is switched on. Tap 4 of TLD 105(1) is coupled to the end of LED tap 104(1-4) to form a circuit from Vin to tap 4 of the TLD 105(1) when tap 4 is switched on.

Similarly, for TLD 105(1), tap 1 of TLD 105(2) is coupled between Vin and LED tap 104(2-1) to form a circuit from Vin to tap 1 of the TLD 105(2) when tap 1 is switched on. Tap 2 of TLD 105(2) is coupled between LED tap 104(2-2) and LED tap 104(2-3) to form a circuit from Vin to tap 2 of the TLD 105(2) when tap 2 is switched on. Tap 3 of TLD 105(2) is coupled between LED tap 104(2-3) and LED tap 104(2-4) to form a circuit from Vin to tap 3 of the TLD 105(2) when tap 3 is switched on. Tap 4 of TLD 105(2) is coupled to the end of LED tap 104(2-4) to form a circuit from Vin to tap 4 of the TLD 105(2) when tap 4 is switched on. The TLDs 105 operate independently but both may be powered by an AC mains power supply 102 and thus would be approximately in phase. Because the most powered on tap of one TLD 105 is coupled with the least powered on tap of the other TLD 105, the power averages out for each LED package. Current output from each tap of the TLDs 105 may be fine-tuned in order to match brightness levels for different combinations of LED taps 104. As with the LED module 300 described above with respect to FIGS. 3A and 3B, many variations are possible, such as variations in number of LEDs 103, number of LED taps 104, number of LEDs 103 per LED package 302, or any other variations are possible, as long as the LED module 300 incorporates LED packages 302 that include LEDs 103 powered by taps of different TLDs 105 in a manner that "averages out" the brightness levels of the different taps of the different TLDs.

Figure 4:
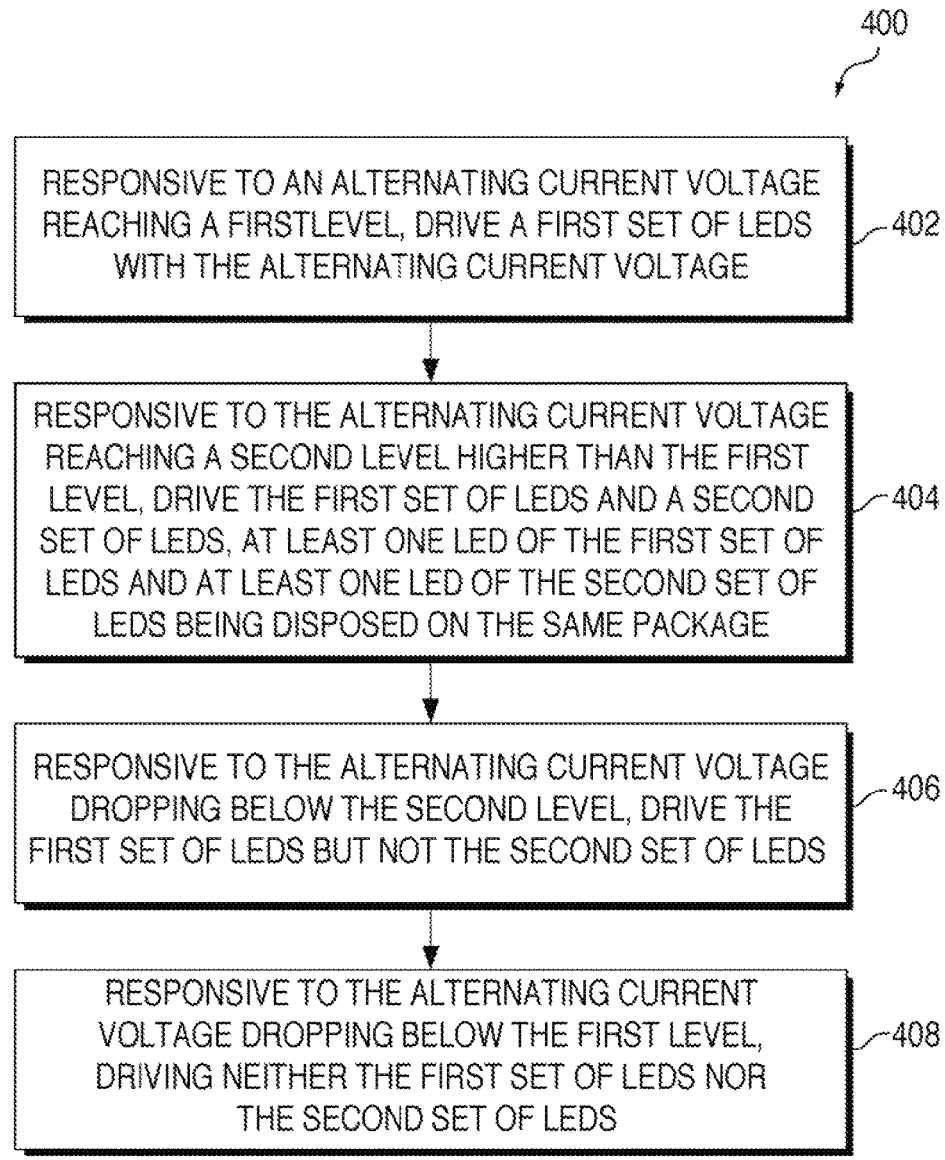
FIG. 4 is a flow diagram of a method for driving LEDs with a tapped linear driver, according to an example.

FIG. 4 is a flow diagram of a method 400 for driving LEDs with a tapped linear driver, according to an example. Although described with respect to the system illustrated with respect to FIGS. 1, 2, and 3A-3D, those of skill in the art will understand that any system configured to perform the steps of the method 400, in any technically feasible alternative order, falls within the scope of the present disclosure.

As shown, the method 400 begins at step 402, where a tapped linear driver ("TLD") 105, in response to an alternating current voltage reaching a first voltage level, drives a first set of LEDs 103 with the alternating current voltage. As described above, the TLD 105 varies the number of LEDs 103 driven depending on the input alternating current voltage. As the voltage increases, the TLD 105 drives a greater number of LEDs 103 and as the voltage decreases, the TLD 105 drives a lesser number of LEDs 103.

At step 404, the alternating current voltage increases above a second voltage level, and, in response, the TLD 105 drives a second set of LEDs 103. At least one of the LEDs 103 of the first set of LEDs is on the same LED package 302 as at least one of the LEDs 103 of the second set of LEDs. This placement on the same package allows the different lighting characteristics associated with the different LED taps 104 to be "averaged out" because the different LEDs 103 on the same LED package 302 are placed close enough together to appear as a single point light source.

At step 404, the alternating current voltage decreases above the second voltage level, and, in response, the TLD 105 stops driving the second set of LEDs. In other words, the TLD 105 drives the first set of LEDs 103 but not the second set of LEDs 103. At step 406, the alternating current voltage decreases above the first voltage level, and, in response, the TLD 105 stops driving both the first set of LEDs and the second set of LEDs. The steps 402-408 repeat as a cycle in conjunction with the alternating current of the alternating current voltage. Because the LEDs connected to different taps are packaged together, the different lighting qualities associated with the different taps are "averaged out."

Thus, some example principles and device embodiments are disclosed herein to help alleviate the flickering issue for LEDs driven by a tapped linear driver. More specifically, various devices described below illustrate arrangements of LEDs that help to reduce the flicker associated with driving the LEDs with a TLD.

Figure 5A:
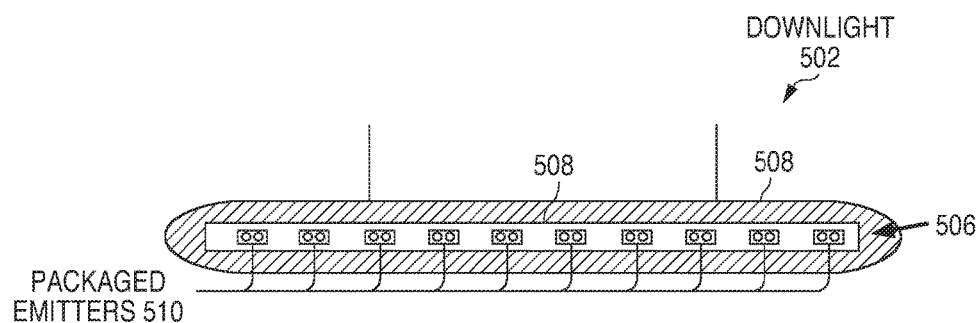
FIGS. 5A-5C illustrate example LED installations that incorporate TLD-driven LEDs.

FIG. 5A illustrates a downlight installation 502 of LEDs according to an example. As shown, the downlight 502 includes a housing 504 that supports a light emitting device array 506. The array of light emitting devices can be organized into any arrangement, for example and as shown, in a linear array. The light emitting device array 506 includes packaged emitters 510 which can be any of the LED packages described above or any technically feasible modification thereof, consistent with the teachings provided herein. The packaged emitters 510 comprise multiple LEDs 103 that share a single package and that are powered by different taps of a TLD 105 so that each LED package appears as a point source of light that with averaged out lighting characteristics of the different taps.

Figure 5B:
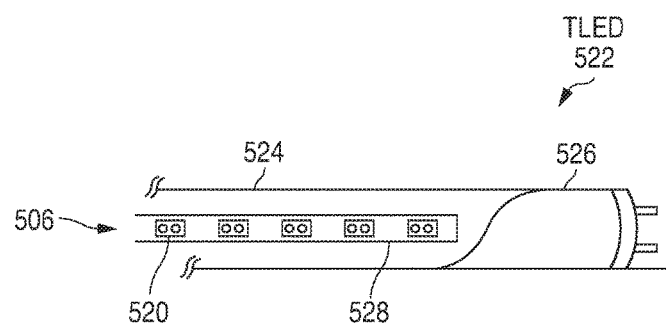

FIG. 5B illustrates a tube light emitting diode (TLED) installation 522 according to an example. As shown, the TLED 522 includes a linear array of LED packages 520 (which can be any of the LED packages 302 described above) that are configured to average out lighting characteristics of LED taps as described above. A rigid or semi-rigid housing 526 supports a rigid or flexible substrate 528 that supports a light emitting device array 506. The rigid or flexible substrate 528 can include printed wiring structures (e.g., traces, thru-holes, connectors, etc.) or other electrically-conductive structures disposed on one or both sides of the rigid or flexible substrate.

Figure 5C:
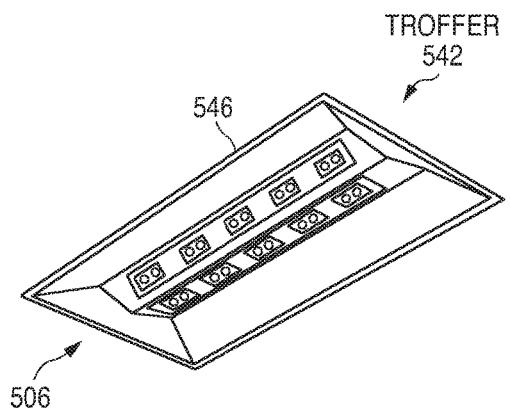

FIG. 5C illustrates a troffer installation 542, according to an example. As shown, the troffer 542 includes a rigid or semi-rigid shaped housing 546 that supports an array of light emitting devices. The array of light emitting devices can be organized into any arrangement, for example and as shown, into an arrangement onto a light emitting device array 506 that is disposed within the boundary of the shaped housing. Some troffers might be composed of more (or fewer) instances of light emitting devices being populated onto the printed wiring board module. The light emitting devices may comprise the LED packages 302 described above, configured to average out lighting characteristics of the different LED taps as described above.

What has been described are ways to package and interconnect LEDs such that the physical design (e.g., layout and interconnection) is simplified while facilitating anti-flicker design techniques involving individually controllable strings of electrically connected LEDs.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light emitting diode ("LED") module comprising:
   a first LED tap and a second LED tap, the first LED tap being powered on for a longer amount of time than the second LED tap, based on an alternating current voltage;
   a first LED package on which a first LED associated with the first LED tap and a second LED associated with the second LED tap are disposed, each of the LEDs in the first LED package being associated with a different tap; and
   a second LED package on which a third LED associated with the first LED tap and a fourth LED associated with the second LED tap are disposed, each of the LEDs in the second LED package being associated with a different tap,
   wherein each of the first LED tap and the second LED tap is associated with a same number of LEDs and the second LED package is disposed a distance along a housing from the first LED package such that the LEDs of the first LED package appear approximately as a point light source and the LEDs of the second LED package appear approximately as a point light source, to average out lighting variations provided to the first LED tap and the second LED tap.

2. The LED module of claim 1, further comprising:
   a first tapped linear driver ("TLD") configured to drive both the first LED tap and the second LED tap based on the alternating current voltage,
   wherein the first TLD is configured to sense an instantaneous voltage of the alternating current voltage and to power different numbers of LEDs based on the instantaneous voltage.

3. The LED module of claim 2, wherein:
   the first LED package further comprises a fifth LED associated with a third LED tap and a sixth LED associated with a fourth LED tap, wherein each of the first LED tap, the second LED tap, the third LED tap, and the fourth LED tap are powered on for different amounts of time based on the alternating current voltage.

4. The LED module of claim 3, wherein:
   the first LED package and the second LED package are included in a set of LED packages, each of which includes four LEDs, each LED of each package being coupled to a different one of the first LED tap, the second LED tap, the third LED tap, and the fourth LED tap,
   the LEDs coupled to the first LED tap, the LEDs coupled to the second LED tap, the LEDs coupled to the third LED tap, and the LEDs coupled to the fourth LED tap are all coupled in series, and
   the LED module further comprises a set of switches, each switch coupled to and corresponding to a different LED tap of the first LED tap, the second LED tap, the third LED tap, and the fourth LED tap, the set of switches configured to control the first LED tap, the second LED tap, the third LED tap, and the fourth LED tap to be powered on for different amounts of time.

5. The LED module of claim 2, further comprising:
   third LED package that comprises a fifth LED associated with a third LED tap and a sixth LED associated with a fourth LED tap.

6. The LED module of claim 5, wherein the first tap is powered on by a first TLD for the most time out of the first through fourth LED taps and the second LED tap is powered on by the first TLD for the least time out of the first through fourth LED taps.

7. The LED module of claim 6, wherein:
   the first LED package and the second LED package are included in a first set of LED packages, wherein each LED package of the first set of LED packages includes an LED powered by the first LED tap and an LED powered by the second LED tap,
   the third LED package is included in a second set of LED packages, wherein each LED package of the second set of LED packages includes an LED powered by the third LED tap and an LED powered by the fourth LED tap,
   the LEDs of the first set of LED packages powered by the first LED tap are coupled in series with the LEDs of the second set of LED packages powered by the third LED tap, which are coupled in series with the LEDs of the second set of LED packages powered by the fourth LED tap, which are coupled in series with the LEDs of the first set of LED packages powered by the second LED tap, and
   the LED module further comprises a set of switches, each switch coupled to and corresponding to a different LED tap of the first LED tap, the second LED tap, the third LED tap, and the fourth LED tap, the set of switches configured to control the first LED tap, the second LED tap, the third LED tap, and the fourth LED tap to be powered on for different amounts of time.

8. The LED module of claim 1, further comprising:
   a first tapped linear driver ("TLD") configured to drive the first LED tap based on the alternating current voltage; and
   a second tapped linear driver configured to drive the second LED tap based on the alternating current voltage.

9. The LED module of claim 8, wherein:
   the first LED package and the second LED package are both included in a first set of LED packages, wherein each LED package in the first set of LED packages includes an LED powered by the first LED tap and an LED powered by the second LED tap; and
   the LED module further comprises a second set of LED packages, wherein each LED package in the second set of LED packages includes an LED powered by a third LED tap driven by the first TLD and an LED powered by a fourth LED tap driven by the second TLD, wherein the third LED tap is turned on for a different amount of time than the fourth LED tap.

10. A method for driving a light emitting diode ("LED") module, the method comprising:
    powering on a first LED tap for a longer amount of time by an alternating current voltage than a second LED tap;
    powering, via the first LED tap, a first LED disposed on a first LED package;
    powering, via the second LED tap, a second LED disposed on the first LED package; and
    powering a third LED associated with the first LED tap and a fourth LED associated with the second LED tap, the third LED and fourth LED being disposed on a second LED package, wherein each of the LEDs in the first LED package is associated with a different tap, each of the LEDs in the second LED package is associated with a different tap, each tap is associated with the same number of LEDs, and the second LED package is disposed a distance along a housing from the first LED package such that the LEDs of the first LED package appear approximately as a point light source and the LEDs of the second LED package appear approximately as a point light source, to average out lighting variations provided to the first LED tap and the second LED tap.

11. The method of claim 10, wherein:
powering the first LED tap and the second LED tap comprises powering the first LED tap and the second LED tap via a first tapped linear driver ("TLD"), wherein the first tapped linear driver is configured to sense an instantaneous voltage of the alternating current voltage and to power different numbers of LEDs based on the instantaneous voltage.

12. The method of claim 11, further comprising:
powering on each of the first LED tap, the second LED tap, a third LED tap associated with a fifth LED disposed on the first LED package, and a fourth LED tap associated with a sixth LED disposed on the first LED package, for different amounts of time based on the alternating current voltage.

13. The method of claim 12, wherein:
the first LED package and the second LED package are included in a set of LED packages, each of which includes four LEDs, each LED of each package being coupled to a different one of the first LED tap, the second LED tap, the third LED tap, and the fourth LED tap,
the LEDs coupled to the first LED tap, the LEDs coupled to the second LED tap, the LEDs coupled to the third LED tap, and the LEDs coupled to the fourth LED tap are all coupled in series, and
the method further comprises controlling the first LED tap, the second LED tap, the third LED tap, and the fourth LED tap to be powered on for different amounts of time, via a set of switches, each switch coupled to and corresponding to a different LED tap of the first LED tap, the second LED tap, the third LED tap, and the fourth LED tap.

14. The method of claim 11, further comprising:
powering a third tap associated with a fifth LED disposed on a third LED package; and
powering a fourth tap associated with a sixth LED disposed on the third LED package.

15. The method of claim 14, wherein the first tap is powered on by a first TLD for the most time out of the first through fourth LED taps and the second LED tap is powered on by the first TLD for the least time out of the first through fourth LED taps.

16. The method of claim 15, wherein:
the first LED package and the second LED package are included in a first set of LED packages, wherein each LED package of the first set of LED packages includes an LED powered by the first LED tap and an LED powered by the second LED tap,
the third LED package is included in a second set of LED packages, wherein each LED package of the second set of LED packages includes an LED powered by the third LED tap and an LED powered by the fourth LED tap,
the LEDs of the first set of LED packages powered by the first LED tap are coupled in series with the LEDs of the second set of LED packages powered by the third LED tap, which are coupled in series with the LEDs of the second set of LED packages powered by the fourth LED tap, which are coupled in series with the LEDs of the first set of LED packages powered by the second LED tap, and
the method further comprises controlling the first LED tap, the second LED tap, the third LED tap, and the fourth LED tap to be powered on for different amounts of time via a set of switches, each switch coupled to and corresponding to a different LED tap of the first LED tap, the second LED tap, the third LED tap, and the fourth LED tap.

17. The method of claim 10, wherein:
powering the first LED tap for the longer amount of time than the second LED tap comprises driving the first LED tap via a first tapped linear driver ("TLD") based on the alternating current voltage and driving the second LED tap via a second TLD based on the alternating current voltage.

18. The method of claim 17, wherein:
the first LED package and the second LED package are both included in a first set of LED packages, wherein each LED package in the first set of LED packages includes an LED powered by the first LED tap and an LED powered by the second LED tap; and
the LED module further comprises a second set of LED packages, wherein each LED package in the second set of LED packages includes an LED powered by a third LED tap driven by the first TLD and an LED powered by a fourth LED tap driven by the second TLD, wherein the third LED tap is turned on for a different amount of time than the fourth LED tap.

19. A light emitting diode ("LED") installation comprising:
a housing, in which is disposed:
a first LED tap and a second LED tap, the first LED tap being powered on for a longer amount of time than the second LED tap, based on an alternating current voltage;
a first LED package on which a first LED associated with the first LED tap and a second LED associated with the second LED tap are disposed, each of the LEDs in the first LED package being associated with a different tap; and
a second LED package on which a third LED associated with the first LED tap and a fourth LED associated with the second LED tap are disposed, each of the LEDs in the second LED package being associated with a different tap,
wherein each of the first LED tap and the second LED tap is associated with a same number of LEDs and the second LED package is disposed a distance along a housing from the first LED package such that the LEDs of the first LED package appear approximately as a point light source and the LEDs of the second LED package appear approximately as a point light source, to average out lighting variations provided to the first LED tap and the second LED tap.

20. The LED installation of claim 19, wherein the housing comprises one of a tube light emitting diode installation housing, a downright installation housing, or a troffer installation housing.

* * * * *